(12) United States Patent
Hamada et al.

(10) Patent No.: US 6,413,619 B1
(45) Date of Patent: Jul. 2, 2002

(54) METHOD OF MAKING CERAMIC MEMBER AND MARKED CERAMIC MEMBER

(75) Inventors: Noriaki Hamada; Youji Furukubo, both of Kagoshima (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 09/627,847

(22) Filed: Jul. 28, 2000

(30) Foreign Application Priority Data

Jul. 29, 1999 (JP) .......................................... 11-214563

(51) Int. Cl.⁷ .......................... B32B 3/00; C03C 10/00; C09D 5/29
(52) U.S. Cl. .............................. 428/209; 501/2; 501/10; 106/31.05
(58) Field of Search .................................. 428/209, 195

(56) References Cited

U.S. PATENT DOCUMENTS 6,045,893 A * 4/2000 Fukushima et al. ......... 428/209

FOREIGN PATENT DOCUMENTS

| JP | 1-141091 | 6/1989 |
|---|---|---|
| JP | 4-210882 | 7/1992 |
| JP | 7-61551 | 7/1995 |
| JP | 408316084 A | * 11/1996 |

* cited by examiner

Primary Examiner—Deborah Jones
Assistant Examiner—Gwendolyn Blackwell-Rudasill
(74) Attorney, Agent, or Firm—Hogan & Hartson, L.L.P.

(57) ABSTRACT

According to the present invention, there is provided a method of marking a ceramic member, which comprises firing, in an atmosphere, a ceramic green body containing at least 0.05% by weight of a color changing agent capable of developing different color tones by heating in different atmospheres, and heating a specific portion of the resulting sintered body in the other atmosphere to form a marking portion whose color tone is different from that of the other portion, and a marked ceramic member, thereby making it possible to easily form a mark having excellent visibility in a short time without increasing the number of processes.

19 Claims, No Drawings

METHOD OF MAKING CERAMIC MEMBER AND MARKED CERAMIC MEMBER

FIELD OF THE INVENTION

The present invention relates to a method of marking ceramic member made of ceramics, a low-temperature fired material and glass, which is used as an insulating substrate of a package for containing a semiconductor device, and a marked ceramic member.

BACKGROUND OF THE INVENTION

As a package for containing a semiconductor device, which is used for containing a semiconductor device, particularly a semiconductor integrated circuit device, for example, those comprising a package body made of ceramics such as alumina ceramics, low-temperature fired ceramics and electrical insulating materials such as glass, and an external lead terminal for electrically connecting the semiconductor device to an external circuit have been known.

In the package for containing the semiconductor device, a mark is formed occasionally on the external surface of the package in order to enable an operator or an automatic assembling machine to recognize product information such as product number and a direction of the package.

According to a conventionally known marking method, marking is conducted by irradiating the surface of the package body with laser light to solve the surface of the package body.

However, when using laser light, marking conditions drastically vary depending on characteristics such as heat resistance and color tone of a material to be marked such as package body. In case where the surface of the material to be marked shows a white or light color, it was difficult to form a clear contrast of color tone between the marking portion and the non-marking portion. Furthermore, a transparent product had such a drawback that the time required for marking becomes longer because laser light is easily transmitted.

To solve these drawbacks, various suggestions have hitherto been made. For example, Unexamined Patent Publication (Kokai) No. 4-210882 discloses a laser marking method comprising coating the surface of a ceramic member with a coating composition, irradiating the surface with laser light to form a mark, and removing the excessive coating composition. According to this method, since the coating composition is vaporized in a range irradiated with laser light and the surface of the ceramic member is carved, vapor of the coating composition is introduced into the formed concave portion, where the coating composition is solidified and deposited, and then baked to develop a black color.

Examined Patent Publication (Kokoku) No. 7-61551 discloses a laser marking method comprising irradiating a ceramic material or glass containing a radiation-sensitive additive made of an inorganic pigment such as zirconium vanadium yellow with laser light, thereby to induce a change in color in a range irradiated with laser light.

Unexamined Patent Publication (Kokai) No. 1-141091 discloses a laser marking method comprising etching the external surface of ceramics colored black by adding chromium oxide using a corrosive chemical such as hydrofluoric acid, and irradiating the etched surface with laser light to form a mark. According to this method, an original color of ceramics is lightened by the etching treatment, while the color changes to a deeper color within the laser light irradiation range so that a contrast of color between the range irradiated with laser light and the etched surface other than the range is enhanced, thereby making it easy to recognize the marking portion as the range irradiated with laser light.

The method described in Unexamined Patent Publication (Kokai) No. 4-210882 has such a drawback that the production cost becomes larger because of large number of processes such as coating of a coating composition, irradiation with laser light and removal of the coating composition.

The method of Examined Patent Publication (Kokoku) No. 7-61551 has such a drawback that, since a large amount of the additive (radiation-sensitive additive) other than the product composition such as ceramics and glass, an adverse influence is liable to be exerted on characteristics of the product and, therefore, the method can not be applied to only a product having a specific composition. Since control of a frequency of laser light is required to cause color change of the additive, process control becomes complicated.

The method described in Unexamined Patent Publication (Kokai) No. 1-141091 has such a drawback that, since the surface of ceramics is etched by using a corrosive chemical, when a metallized layer is formed on the surface of the ceramics, the strength of bonding between the metallized layer and ceramics is reduced. Since the process of etching is required, the number of processes increases, resulting in high production cost.

Furthermore, a conventional laser marking method has such a problem that, since the low-temperature fired material or glass product containing a large amount of a glass component hardly absorb laser light, the laser light irradiation time becomes larger, resulting in poor productivity.

SUMMARY OF THE INVENTION

A main object of the present invention is to provide a method of marking a ceramic member, capable of easily forming a mark having excellent visibility in a short time without increasing the number of processes.

Another object of the present invention is to provide a ceramic member on which a mark having excellent visibility is formed.

The present inventors have intensively studied to attain the objects described above. As a result, they have paid attention to the fact that a compound capable of developing different color tones by heating in different atmospheres exists, and found a new fact that a mark having excellent visibility can be formed easily in a short time without increasing the number of processes by containing the compound as a color changing agent in a ceramic green body, followed by firing in different atmospheres and further heat treatment. Thus, the present invention has been completed.

The marking method of the present invention comprises firing, in an atmosphere, a ceramic green body containing a color changing agent capable of developing different color tones by heating in different atmospheres, and heating a specific portion of the resulting sintered body in the other atmosphere to form a marking portion whose color tone is different from that of the other portion.

The different atmospheres are an oxidizing atmosphere and a reducing atmosphere, and the specific portion of the sintered body obtained by firing in any one of the atmospheres is heated in the other atmosphere.

The specific portion of the sintered body is preferably heated by irradiation with laser light, thereby making it possible to form a mark having excellent visibility in a short time.

The color changing agent includes, for example, a simple substance, an oxide or a composite oxide of at least one metal selected from the group consisting of Mn, Fe, V, Se and Cu. These metal elements or compounds have a property capable of changing the color tone by heating in different atmospheres.

At least 0.05% by weight of the color changing agent is preferably contained in the ceramic green body.

A ceramic member of the present invention has a marking portion, whose color tone is different from that of the other portion, formed on the surface. The ceramic member comprises ceramics containing a color changing agent, and the valence of the color changing agent in the marking portion is different from that of the color changing agent in the portion other than the marking portion.

In this case, the valence of the color changing agent in the marking portion is larger than that in the portion other than the marking portion.

The ceramics include, for example, glass ceramics. A circuit made of copper or silver is formed on the surface or in the ceramic member.

The other objects and advantages of the present invention will becomes apparent from the following detailed description.

DETAILED DESCRIPTION OF THE INVENTION

In the present invention, the color changing agent capable of developing different color tones by heating in different atmospheres refers to the above-described compound capable of changing a color tone by a heat treatment in an oxidizing atmosphere and a heat treatment in a reducing atmosphere, and specific examples include a simple substance, an oxide or a composite oxide of metals such as Mn, Fe, V, Se and Cu. The color developing agent is preferably used in the form of the oxide. For example, a color is hardly developed even if $MnO_2$ is added in the ceramic composition, followed by heat treatment in the reducing atmosphere, but a violet color is developed when subjecting to a heat treatment in the oxidizing atmosphere.

Such a change in color is caused by oxidizing $MnO_2$ to change the valance of Mn to 6 or 7 from 4.

Examples of change in color tone of the other color changing agents are described below.

| | | |
|---|---|---|
| $Fe_2O_3$ | Yellowish green ($Fe^{3+}$) | Bluish green ($Fe^{3+}$) |
| $V_2O_5$ | Yellow to Yellowish green | Emerald green |
| Se | Colorless ($Se^{2+}$) | Brown ($Se^{2-}$) |
| Cu | Colorless ($Cu^{2+}$) | Red ($Cu^0$) |
| | Blue to Bluish green ($Cu^{2+}$) | |

The oxidizing atmosphere refers to a heat treatment in an air or an oxygen atmosphere. The reducing atmosphere refers to a heat treatment in a nitrogen atmosphere or a hydrogen atmosphere.

The ceramic green body may be heat-treated in an oxidizing or reducing atmosphere after firing in a high-vacuum atmosphere. In this case, the color changing agent does not develop or change a color by the heat treatment in the high-vacuum atmosphere, but can develop or change into a specific color by the heat treatment in the oxidizing or reducing atmosphere.

The color changing agent is preferably contained in the ceramic green body in the amount of at least 0.05% by weight. When the amount of the color changing agent is less than 0.05% by weight, there is a fear that a mark can not be identified even if the color is changed. The upper limit of the amount of the color changing agent is not specifically limited as far as it does not exert an adverse influence on characteristics of ceramics, but the amount is preferably 5% by weight or less. The color changing agents may be used in combination.

For the purpose of uniformly coloring ceramics, a coloring agent can be contained in the ceramic green body, together with the color changing agent. The coloring agent includes, for example, $Cr_2O_3$ (green), $Co_2O_3$ (Prussian blue) and $Er_2O_3$ (pink) (color in the parenthesis represents a color developed by each coloring agent). When using the coloring agent, the amount of the coloring agent contained in the ceramic green body is preferably 5% by weight or less.

The ceramic green body containing the color changing agent is obtained by mixing various raw powders such as glass ceramic and alumina powders with a predetermined amount of the color changing agent, adding a small amount of a synthetic resin binder to the mixed powders, and forming the resulting admixture using a known forming means. The forming means includes, for example, doctor blade method, press forming method, rolling method and calender rolling method.

After the completion of forming, the resulting ceramic green body is fired. On firing, the green body is heated to the temperature of about 700° C. to remove the binder component incorporated for forming, and then properly fired. The firing is conducted at the temperature of about 800 to 1050° C. in case of glass ceramics, while it is conducted at the temperature of 1300 to 1700° C. in case of alumina. On firing, the coloring agent incorporated in the green body develops a color.

After the completion of firing, the resulting sintered body is marked by irradiating the specific portion with laser light. The laser light used for irradiation is preferably laser light capable of heating the surface of the sintered body to at least 750° C. and, for example, YAG laser and ruby laser can be used.

In this case, since the color changing agent in the present invention can rapidly change the color by a heat treatment in different atmospheres, a laser irradiation time can be remarkably reduced as compared with a conventional laser marking method and the marking can be usually conducted at an irradiation rate of about 10 to 20 mm/second. Accordingly, the productivity is improved and the surface layer of the sintered body is hardly damaged by irradiation with laser light.

The ceramic member to which the method of the present invention is applied includes, for example, ceramics such as alumina, mullite and aluminum nitride; $SiO_2$—$Al_2O_3$—CaO—, $SiO_2$—$Al_2O_3$—$B_2O_3$— and $SiO_2$—BaO—$B_2O_3$—$Al_2O_3$—CaO-based glasses; and low-temperature fired materials (so-called glass ceramics) prepared by adding 5 to 80% by volume of fillers such as alumina, quartz, enstatite, mullite and forsterite in these glasses.

It has hitherto been very difficult to form a mark to the low-temperature fired material and glass, because they contain a glass component. However, a mark having excellent visibility can be formed easily by irradiation with laser light in a very short time according to the method of the present invention, which is particularly useful.

The marking method of the present invention is particularly suited to form a mark on an insulating substrate in a package for containing a semiconductor device, and to form a mark of various product informations and various displays on various electronic parts using a ceramic member, circuit boards wherein a wiring circuit layer is formed on the surface of or in an insulating substrate, various structural ceramic parts, and ceramic processed parts.

The marking method of the present invention is most useful to a package or circuit board wherein a circuit made of silver or copper, formed by firing together with an insulating substrate, was formed on the surface of or in the insulating substrate made of the low-temperature firing material.

EXAMPLES

The following Examples further illustrate the present invention in detail, but the present invention is not limited by the Examples.

Example 1

A glass ceramic composition containing 43% (by weight) $SiO_2$-37% BaO-9% $B_2O_3$-6% $Al_2O_3$-5% CaO (Pb content: 50 ppmor less, deformation point: 700° C., thermal expansion coefficient: 7.0 ppm/° C.) was prepared as glass. Then, quartz ($SiO_2$, linear thermal expansion coefficient: 15 ppm/° C.) as a filler component and $MnO_2$ (color changing agent) as an additive were weighed and mixed with the glass ceramic composition in accordance with the formulation shown in Table 1. In the same manner as that described above, except that $Cr_2O_3$ (coloring agent) was added as the other additive, a mixture of the formulation in Table 2 was obtained.

Each of the resulting mixtures was pulverized, followed by the addition of an organic binder and an organic solvent and further sufficient admixing. The admixture was formed into a tape by a doctor blade method and plural green sheets thus obtained were laminated with each other to obtain a green body having a desired shape.

This green body was subjected to a binder removing treatment in an atmosphere ($N_2$+$H_2O$) at 700° C., and then fired in a nitrogen atmosphere or an air at 920° C. to obtain a sintered body having a color tone shown in Table 1 and Table 2.

Then, the resulting sintered body was subjected to laser marking at a specific portion in an atmosphere which is the same as or different from that on firing. YAG laser was used as the laser and the marking portion was heated to about 800° C. by irradiating with laser light at a rate of 15 mm/second. Color tones of the resulting marking portion are summarized in Table 1 and Table 2. In Table 1 and Table 2, a clear difference in color tone was recognized between the marking portion and the other portion. Those where a mark can be visually recognized easily were rated "○", while those where a mark is hardly recognized were rated "X".

TABLE 1

| NO. | Amount of glass (% by weight) | Amount of quartz (% by weight) | Additives Kind | Additives Content (% by weight) | Firing atmosphere | Color tone | Atmosphere on laser marking | Color tone of mark | Identification of mark |
|---|---|---|---|---|---|---|---|---|---|
| *1 | 50 | 50 | — | 0 | $N_2$ | White | Air | White | × |
| 2 | 50 | 49.95 | $MnO_2$ | 0.05 | $N_2$ | White | Air | Light violet | ○ |
| 3 | 50 | 49.5 | $MnO_2$ | 0.5 | $N_2$ | White | Air | Violet | ○ |
| 4 | 50 | 49 | $MnO_2$ | 1 | $N_2$ | White | Air | Violet | ○ |
| 5 | 50 | 45 | $MnO_2$ | 5 | $N_2$ | White | Air | Violet | ○ |
| *6 | 50 | 50 | — | 0 | $N_2$ | White | $N_2$ | White | × |
| *7 | 50 | 49.95 | $MnO_2$ | 0.05 | $N_2$ | White | $N_2$ | White | × |
| *8 | 50 | 49.5 | $MnO_2$ | 0.5 | $N_2$ | White | $N_2$ | White | × |
| *9 | 50 | 49 | $MnO_2$ | 1 | $N_2$ | White | $N_2$ | White | × |
| *10 | 50 | 45 | $MnO_2$ | 5 | $N_2$ | White | $N_2$ | White | × |
| *11 | 50 | 50 | — | 0 | Air | White | $N_2$ | White | × |
| 12 | 50 | 49.95 | $MnO_2$ | 0.05 | Air | Light violet | $N_2$ | White | ○ |
| 13 | 50 | 49.5 | $MnO_2$ | 0.5 | Air | Violet | $N_2$ | White | ○ |
| 14 | 50 | 49 | $MnO_2$ | 1 | Air | Violet | $N_2$ | White | ○ |
| 15 | 50 | 45 | $MnO_2$ | 5 | Air | Violet | $N_2$ | White | ○ |
| *16 | 50 | 50 | — | 0 | Air | White | Air | White | × |
| *17 | 50 | 49.95 | $MnO_2$ | 0.05 | Air | Light violet | Air | Light violet | × |
| *18 | 50 | 49.5 | $MnO_2$ | 0.5 | Air | Violet | Air | Violet | × |
| *19 | 50 | 49 | $MnO_2$ | 1 | Air | Violet | Air | Violet | × |
| *20 | 50 | 45 | $MnO_2$ | 5 | Air | Violet | Air | Violet | × |

Samples with an asterisk (*) are not within the scope of the present invention.

TABLE 2

| NO. | Amount of glass (% by weight) | Amount of quartz (% by weight) | Additives Kind | Additives Content (% by weight) | Firing atmosphere | Color tone | Atmosphere on laser marking | Color tone of mark | Identification of mark |
|---|---|---|---|---|---|---|---|---|---|
| *21 | 50 | 49.5 | $Cr_2O_3$ | 0.5 | $N_2$ | Green | Air | Green | × |
| 22 | 50 | 49.45 | $Cr_2O_3$/$MnO_2$ | 0.5/0.05 | $N_2$ | Green | Air | Dark green | ○ |
| 23 | 50 | 49 | $Cr_2O_3$/$MnO_2$ | 0.5/0.5 | $N_2$ | Green | Air | Dark green | ○ |
| 24 | 50 | 48.5 | $Cr_2O_3$/$MnO_2$ | 0.5/1 | $N_2$ | Green | Air | Dark violet | ○ |
| 25 | 50 | 44.5 | $Cr_2O_3$/$MnO_2$ | 0.5/5 | $N_2$ | Green | Air | Dark violet | ○ |

TABLE 2-continued

| | Amount of glass | Amount of quartz | Additives | | | Atmosphere | | | Identification |
|---|---|---|---|---|---|---|---|---|---|
| NO. | (% by weight) | (% by weight) | Kind | Content (% by weight) | Firing atmosphere | Color tone | on laser marking | Color tone of mark | of mark |
| *26 | 50 | 49.5 | $Cr_2O_3$ | 0.5 | $N_2$ | Green | $N_2$ | Green | × |
| *27 | 50 | 49.45 | $Cr_2O_3/MnO_2$ | 0.5/0.05 | $N_2$ | Green | $N_2$ | Green | × |
| *28 | 50 | 49 | $Cr_2O_3/MnO_2$ | 0.5/0.5 | $N_2$ | Green | $N_2$ | Green | × |
| *29 | 50 | 48.5 | $Cr_2O_3/MnO_2$ | 0.5/1 | $N_2$ | Green | $N_2$ | Green | × |
| *30 | 50 | 44.5 | $Cr_2O_3/MnO_2$ | 0.5/5 | $N_2$ | Green | $N_2$ | Green | × |
| *31 | 50 | 49.5 | $Cr_2O_3$ | 0.5 | Air | Green | $N_2$ | Green | × |
| 32 | 50 | 49.45 | $Cr_2O_3/MnO_2$ | 0.5/0.05 | Air | Dark green | $N_2$ | Green | ○ |
| 33 | 50 | 49 | $Cr_2O_3/MnO_2$ | 0.5/0.5 | Air | Dark green | $N_2$ | Green | ○ |
| 34 | 50 | 48.5 | $Cr_2O_3/MnO_2$ | 0.5/1 | Air | Dark violet | $N_2$ | Green | ○ |
| 35 | 50 | 44.5 | $Cr_2O_3/MnO_2$ | 0.5/5 | Air | Dark violet | $N_2$ | Green | ○ |
| *36 | 50 | 49.5 | $Cr_2O_3$ | 0.5 | Air | Green | Air | Green | × |
| *37 | 50 | 49.45 | $Cr_2O_3/MnO_2$ | 0.5/0.05 | Air | Dark green | Air | Dark green | × |
| *38 | 50 | 49 | $Cr_2O_3/MnO_2$ | 0.5/0.5 | Air | Dark green | Air | Dark green | × |
| *39 | 50 | 48.5 | $Cr_2O_3/MnO_2$ | 0.5/1 | Air | Dark violet | Air | Dark violet | × |
| *40 | 50 | 44.5 | $Cr_2O_3/MnO_2$ | 0.5/5 | Air | Dark violet | Air | Dark violet | × |

Samples with an asterisk (*) are not within the scope of the present invention.

As is apparent from Table 1 and Table 2, regarding samples Nos. 1, 6, 11, 16, 21, 26, 31 and 36 wherein the color changing agent was not added, a difference in color tone did not appears between the marking portion and the non-marking portion and visual identification of a mark was hardly conducted, although the atmosphere on firing is different from that on laser marking.

On the other hand, regarding samples Nos. 2 to 5, 12 to 15, 22 to 25 and 32 to 35 wherein the color changing agent was added, since the atmosphere on firing is different from that on laser marking, a difference in color tone was clear between the marking portion and the non-marking portion and visual identification of a mark was easily conducted.

Regarding samples Nos. 7 to 10, 17 to 20, 27 to 30 and 37 to 40, since the atmosphere on firing is the same as that on laser marking regardless of the addition of the color changing agent, a change in color tone did not occur between the marking portion and the non-marking portion and visual identification of a mark was hardly conducted.

Example 2

In the same manner as in Example 1, except that $Fe_2O_3$, $V_2O_5$, Se and Cu (any of them is a color changing agent) as the additive were added in the amount shown in Table 3 and that firing and laser marking at a specific portion were conducted in the atmosphere shown in the same table, marking was conducted. The results are summarized in Table 3.

TABLE 3

| | Amount of glass | Amount of quartz | Additives | | | Atmosphere | | | Identification |
|---|---|---|---|---|---|---|---|---|---|
| NO. | (% by weight) | (% by weight) | Kind | Content (% by weight) | Firing atmosphere | Color tone | on laser marking | Color tone of mark | of mark |
| 41 | 50 | 49.95 | $Fe_2O_3$ | 0.05 | Air | Yellowish green | $N_2$ | Bluish green | ○ |
| 42 | 50 | 49.50 | $Fe_2O_3$ | 0.5 | Air | Yellowish green | $N_2$ | Bluish green | ○ |
| 43 | 50 | 49.00 | $Fe_2O_3$ | 1 | Air | Yellowish green | $N_2$ | Bluish green | ○ |
| 44 | 50 | 45.00 | $Fe_2O_3$ | 5 | Air | Yellowish green | $N_2$ | Bluish green | ○ |
| 45 | 50 | 49.95 | $V_2O_5$ | 0.05 | Air | Yellow | $N_2$ | Emerald green | ○ |
| 46 | 50 | 49.50 | $V_2O_5$ | 0.5 | Air | Yellow | $N_2$ | Emerald green | ○ |
| 47 | 50 | 49.00 | $V_2O_5$ | 1 | Air | Yellow | $N_2$ | Emerald green | ○ |
| 48 | 50 | 45.00 | $V_2O_5$ | 5 | Air | Yellow | $N_2$ | Emerald green | ○ |
| 49 | 50 | 49.95 | Se | 0.05 | Air | White | $N_2$ | Brown | ○ |
| 50 | 50 | 49.95 | Se | 0.5 | Air | White | $N_2$ | Brown | ○ |
| 51 | 50 | 49.00 | Se | 1 | Air | White | $N_2$ | Brown | ○ |
| 52 | 50 | 45.00 | Se | 5 | Air | White | $N_2$ | Brown | ○ |
| 53 | 50 | 49.95 | Cu | 0.05 | Air | White | $N_2$ | Red | ○ |
| 54 | 50 | 49.50 | Cu | 0.5 | Air | White | $N_2$ | Red | ○ |
| 55 | 50 | 49.00 | Cu | 1 | Air | White | $N_2$ | Red | ○ |
| 56 | 50 | 45.00 | Cu | 5 | Air | White | $N_2$ | Red | ○ |

As is apparent from Table 3, also in case where $Fe_2O_3$, $V_2O_5$, Se and Cu were added, each specific color tone can be developed in the marking portion and the non-marking portion by firing and irradiating with light in different atmospheres and visual identification of a mark was easily conducted.

What is claimed is:
1. A ceramic member having a marking portion, whose color tone is different from that of a portion other than the marking portion, on the surface, comprising ceramics containing a color changing agent, wherein the valence of the color changing agent in the marking portion is different from the valence of the color changing agent in the portion other than the marking portion and wherein the color changing agent is an oxide of at least one metal selected from the group consisting of Mn, Fe, V, Se and Cu, a composite oxide of at least one metal selected from the group consisting of Mn, Fe, V, Se and Cu, and mixtures thereof.

2. The ceramic member according to claim 1, wherein the color changing agent has a property capable of developing different colors by heating in different atmosphere.

3. The ceramic member according to claim 1, wherein the valence of the color changing agent in the marking portion is larger than that of the color changing agent in the portion other than the marking portion.

4. The ceramic member according to claim 1, wherein the ceramics are glass ceramics.

5. The ceramic member according to claim 1, wherein a circuit made of copper or silver is formed on the surface of or in the ceramic member.

6. The ceramic member according to claim 1, wherein the color changing agent is contained in the ceramic in an amount of at least about 0.05% by weight.

7. The ceramic member according to claim 1, wherein the color changing agent is contained in the ceramic in an amount no greater than about 5% by weight.

8. The ceramic member according to claim 1, wherein the color changing agent is contained in the ceramic in an amount between about 0.05% and 5% by weight.

9. The ceramic member according to claim 1, wherein the color changing agent is $MnO_2$.

10. The ceramic member according to claim 2, wherein the color changing agent is $MnO_2$.

11. The ceramic member according to claim 1, wherein the color changing agent is $Fe_2O_3$.

12. The ceramic member according to claim 1, wherein the color changing agent is Se.

13. The ceramic member according to claim 1, wherein the color changing agent is Cu.

14. The ceramic member according to claim 8, wherein the color changing agent is $MnO_2$.

15. The ceramic member according to claim 1, wherein the ceramics is selected from the group consisting of alumina, mullite and aluminum nitride.

16. The ceramic member according to claim 1, wherein the ceramics is selected from the group consisting of $SiO_2$—$Al_2O_3$—CaO—, $SiO_2$—$Al_2O_3$—$B_2O_3$— and $SiO_2$—BaO—$B_2O_3$—$Al_2O_3$—CaO-based glasses.

17. The ceramic member according to claim 1, wherein the ceramics also contains a coloring agent.

18. The ceramic member according to claim 1, wherein the ceramics also contains a coloring agent selected from the group consisting of $Cr_2O_3$, $Co_2O_3$ and $Er_2O_3$.

19. The ceramic member according to claim 1, wherein the ceramics also contains a coloring agent present in an amount of about 5% by weight or less.

* * * * *